(12) United States Patent
Cho et al.

(10) Patent No.: US 9,070,904 B2
(45) Date of Patent: Jun. 30, 2015

(54) METHOD OF MANUFACTURING ORGANIC LIGHT EMITTING DIODE DISPLAY

(71) Applicant: SAMSUNG DISPLAY CO., LTD., Yongin, Gyeonggi-Do (KR)

(72) Inventors: Kyu-Sik Cho, Yongin (KR); Joon-Hoo Choi, Yongin (KR); Byoung-Kwon Choo, Yongin (KR); Min-Chul Shin, Yongin (KR); Tae-Hoon Yang, Yongin (KR); Won-Kyu Lee, Yongin (KR); Yun-Gyu Lee, Yongin (KR); Bo-Kyung Choi, Yongin (KR); Yong-Hwan Park, Yongin (KR); Sang-Ho Moon, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/193,227

(22) Filed: Feb. 28, 2014

(65) Prior Publication Data
US 2014/0179044 A1 Jun. 26, 2014

Related U.S. Application Data

(62) Division of application No. 13/137,791, filed on Sep. 13, 2011, now Pat. No. 8,927,991.

(30) Foreign Application Priority Data

Oct. 27, 2010 (KR) .......................... 10-2010-0105405

(51) Int. Cl.
*H01L 51/40* (2006.01)
*H01L 51/56* (2006.01)
*H01L 27/12* (2006.01)
*H01L 27/32* (2006.01)

(52) U.S. Cl.
CPC ............ *H01L 51/56* (2013.01); *H01L 27/1255* (2013.01); *H01L 27/1288* (2013.01); *H01L 27/3262* (2013.01); *H01L 27/3265* (2013.01)

(58) Field of Classification Search
CPC . H01L 27/1255; H01L 27/1288; H01L 51/56; H01L 27/3262; H01L 27/3265; H01L 27/1214; H01L 27/12; H01L 27/3244; H01L 27/124; H01L 29/4908; G09G 3/3233; G09G 2300/0842; G09G 2320/043
USPC .................................................. 438/34, 82, 99
See application file for complete search history.

(56) References Cited

U.S. PATENT DOCUMENTS

2007/0148799 A1  6/2007  Yang et al.
2009/0224257 A1*  9/2009  Chin et al. ...................... 257/72

(Continued)

FOREIGN PATENT DOCUMENTS

| KR | 10-2001-0066393 A | 7/2001 |
| KR | 10-2002-0023540 A | 3/2002 |
| KR | 10-2008-0010865 A | 1/2008 |

(Continued)

*Primary Examiner* — Michelle Mandala
(74) *Attorney, Agent, or Firm* — Lee & Morse, P.C.

(57) ABSTRACT

An OLED display includes a first polysilicon layer pattern on a substrate having a first gate electrode, a second gate electrode, and a first capacitor electrode, a gate insulating layer pattern, a second polysilicon layer pattern including a first active layer, a second active layer, and a capacitor polycrystalline dummy layer, a third amorphous silicon layer pattern including first source and drain resistant contact layers on a predetermined region of the first active layer, second source and drain resistant contact layers on a predetermined region of the second active layer, and a capacitor amorphous dummy layer on the capacitor polycrystalline dummy layer, and a data metal layer pattern including first source/drain electrodes, second source/drain electrodes, and a second capacitor electrode.

10 Claims, 14 Drawing Sheets

(56) References Cited

U.S. PATENT DOCUMENTS

2009/0321737 A1 12/2009 Isa et al.
2011/0017999 A1 1/2011 Choi

FOREIGN PATENT DOCUMENTS

| KR | 10-2008-0076127 A | 8/2008 |
| KR | 10-2009-0047994 A | 5/2009 |

* cited by examiner

METHOD OF MANUFACTURING ORGANIC LIGHT EMITTING DIODE DISPLAY

CROSS REFERENCE TO RELATED APPLICATION

This is a divisional application based on pending application Ser. No. 13/137,791, filed Sep. 13, 2011, the entire contents of which is hereby incorporated by reference.

BACKGROUND

1. Field

The described technology relates generally to an organic light emitting diode (OLED) display with a bottom gate structure, and a manufacturing method thereof.

2. Description of the Related Art

An organic light emitting diode (OLED) display has been paid much attention as a next-generation display because of its merits, e.g., a wide viewing angle, a fast response rate, and a relatively lower power consumption, as well as lower weight and size.

The OLED display generally uses a low temperature polycrystalline silicon thin film transistor (LTPS TFT) having good carrier mobility, which may be applicable in a high speed operational circuit and in a CMOS circuit. The LTPS TFT may require a relatively higher number of thin film processes during formation thereof. However, as the OLED display becomes larger and requires a higher number of thin film processes during the manufacturing process, productivity of the OLED display may deteriorate.

The above information disclosed in this Background section is only for enhancement of understanding of the background of the described technology and therefore it may contain information that does not form the prior art that is already known in this country to a person of ordinary skill in the art.

SUMMARY

The described technology has been made in an effort to provide an OLED display with a bottom gate structure having a simplified manufacturing process.

The described technology has also been made in an effort to provide a simplified method for manufacturing an OLED display with a bottom gate structure.

An exemplary embodiment provides an OLED display, including a first polysilicon layer pattern on a substrate, the first polysilicon layer pattern being impurity-doped and including a first gate electrode, a second gate electrode, and a first capacitor electrode, a gate insulating layer pattern on the first polysilicon layer pattern, a second polysilicon layer pattern including a first active layer, a second active layer, and a capacitor polycrystalline dummy layer on respective first gate electrode, second gate electrode, and first capacitor electrode, a third amorphous silicon layer pattern, the third amorphous silicon layer pattern being impurity-doped and including first source and drain resistant contact layers on a predetermined region of the first active layer, second source and drain resistant contact layers on a predetermined region of the second active layer, and a capacitor amorphous dummy layer on the capacitor polycrystalline dummy layer, and a data metal layer pattern including a first source electrode, a first drain electrode, a second source electrode, a second drain electrode, and a second capacitor electrode on respective first source resistant contact layer, first drain resistant contact layer, second source resistant contact layer, second drain resistant contact layer, and capacitor amorphous dummy layer.

The gate insulating layer pattern may include a plurality of contact holes partially revealing the first polysilicon layer pattern, the gate insulating layer pattern overlapping and having a substantially same pattern as the first polysilicon layer pattern except the contact holes.

The third amorphous silicon layer pattern may have a substantially same pattern as the data metal layer pattern.

The metal data layer may include at least one of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

The OLED display may further include an interlayer insulating layer on the data metal layer pattern, a connecting metal layer pattern on the interlayer insulating layer, the connecting metal layer pattern including a gate line connected to the first gate electrode, a first connector connecting the second gate electrode and the first drain electrode, a second connector connecting the first source electrode and a data line, a third connector connecting the second source electrode and a common power line, and a fourth connector connecting the second drain electrode and the second capacitor electrode, and a transparent conductive layer pattern on the interlayer insulating layer and the connecting metal layer pattern.

The transparent conductive layer pattern may include a pixel electrode on the interlayer insulating layer and connected to the second drain electrode.

The OLED display may further include an organic emission layer and a common electrode stacked on the pixel electrode.

The transparent conductive layer pattern may include at least one of indium tin oxide (ITO), indium zinc oxide (IZO), zinc oxide (ZnO), indium oxide ($In_2O_3$), indium gallium oxide (IGO), and aluminum zinc oxide (AZO).

Another exemplary embodiment provides a method for manufacturing an organic light emitting diode (OLED) display, including sequentially stacking an impurity-doped first amorphous silicon layer, a gate insulating layer, and an impurity-non-doped second amorphous silicon layer on a substrate, forming a first polysilicon layer and a second polysilicon layer by crystallizing the first and the second amorphous silicon layers, respectively, forming a first polysilicon layer pattern, a gate insulating layer pattern, and a second polysilicon layer pattern intermediate in the same pattern by patterning the first polysilicon layer, the gate insulating layer, and the second polysilicon layer, sequentially stacking an impurity-doped third amorphous silicon layer and a data metal layer on the second polysilicon layer pattern intermediate, forming a photosensitive film pattern with a plurality of thicknesses on the data metal layer, and forming a second polysilicon layer pattern, a third amorphous silicon layer pattern, and a data metal layer pattern by patterning the second polysilicon layer pattern intermediate, the third amorphous silicon layer, and the data metal layer through the photosensitive film pattern.

Forming the second polysilicon layer pattern, third amorphous silicon layer pattern, and data metal layer pattern may include forming a second polysilicon layer pattern, a third amorphous silicon layer pattern intermediate, and a data metal layer pattern intermediate by patterning the second polysilicon layer pattern intermediate, the third amorphous silicon layer, and the data metal layer through a first etching process using the photosensitive film pattern, and forming a third amorphous silicon layer pattern and a data metal layer pattern by patterning the third amorphous silicon layer pattern intermediate and the data metal layer pattern intermediate through a second etching process using the photosensitive film pattern.

The first polysilicon layer pattern may include a first gate electrode, a second gate electrode, and a first capacitor electrode, the second polysilicon layer pattern may include a first active layer and a second active layer formed on the first gate electrode and the second gate electrode, respectively, and a capacitor polycrystalline dummy layer formed on the first capacitor electrode, the third amorphous silicon layer pattern may include a first source resistant contact layer and a first drain resistant contact layer respectively formed on a predetermined region of the first active layer, a second source resistant contact layer and a second drain resistant contact layer formed on a predetermined region of the second active layer, a capacitor amorphous dummy layer formed on the capacitor polycrystalline dummy layer, a dummy data line, and a dummy common power line, and the data metal layer pattern may include a first source electrode, a first drain electrode, a second source electrode, and a second drain electrode respectively formed on the first source resistant contact layer, the first drain resistant contact layer, the second source resistant contact layer, and the second drain resistant contact layer, a second capacitor electrode formed on the capacitor amorphous dummy layer, a data line formed on the dummy data line, and a common power line formed on the dummy common power.

The photosensitive film pattern may include a first thickness unit, a second thickness unit thinner than the second thickness unit, and an opening substantially having no thickness.

The first thickness unit of the photosensitive film pattern may correspond to positions at which the first source electrode, the first drain electrode, the second source electrode, the second drain electrode, and the second capacitor electrode will be formed, and the second thickness unit of the photosensitive film pattern may correspond to channel regions of the first active layer and the second active layer that are not overlapped on the first source electrode, the first drain electrode, the second source electrode, and the second drain electrode.

The first etching process may be performed through the first thickness unit and the second thickness unit of the photosensitive film pattern, and the second etching process may be performed through the first thickness unit when the second thickness unit of the photosensitive film pattern is removed.

The data metal layer may be formed of at least one of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

The method may further include forming an interlayer insulating layer on the data metal layer pattern, forming a plurality of contact holes for partially revealing the first gate electrode, the second gate electrode, the first source electrode, the second source electrode, the first drain electrode, the second drain electrode, and the second capacitor electrode by etching at least one of the interlayer insulating layer and the gate insulating layer pattern, forming a connecting metal layer pattern on the interlayer insulating layer, and forming a transparent conductive layer pattern on the interlayer insulating layer and the connecting metal layer pattern.

The transparent conductive layer pattern may be formed of at least one of indium tin oxide (ITO), indium zinc oxide (IZO), zinc oxide (ZnO), indium oxide ($In_2O_3$), indium gallium oxide (IGO), and aluminum zinc oxide (AZO).

The connecting metal layer pattern may include a gate line connected to the first gate electrode through the plurality of contact holes, a first connector for connecting the second gate electrode and the first drain electrode, a second connector for connecting the first source electrode and a data line, a third connector for connecting the second source electrode and a common power line, and a fourth connector for connecting the second drain electrode and the second capacitor electrode.

The transparent conductive layer pattern may further include a pixel electrode formed on the interlayer insulating layer and connected to the second drain electrode.

The method may further include forming an organic emission layer on the pixel electrode, and forming a common electrode on the organic emission layer.

DETAILED DESCRIPTION

Figure 1:
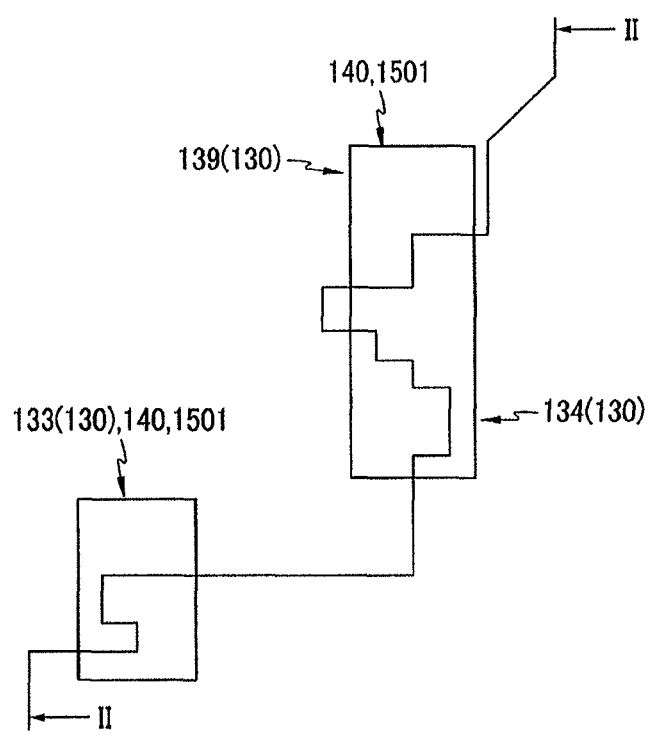
FIG. 1 to FIG. 13 illustrate cross-sectional views of a process for manufacturing an OLED display according to an exemplary embodiment.

Korean Patent Application No. 10-2010-0105405, filed on Oct. 27, 2010, in the Korean Intellectual Property Office, end entitled: "Organic Light Emitting Display Device and Method for Manufacturing the Same" is incorporate by reference herein in its entirety.

Example embodiments will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In addition, parts not related to the description are omitted for clear description of the example embodiments, and like reference numerals designate like elements and similar constituent elements throughout the specification. Also, in the drawings, the sizes and thicknesses of the components are merely shown for convenience of explanation, and therefore example embodiments are not necessarily limited to the illustrations described and shown herein. In the drawings, the thickness of layers, films, panels, regions, etc., are exaggerated for clarity. It will be understood that when an element such as a layer, film, region, or substrate is referred to as being "on" another element, it can be directly on the other element or intervening elements may also be present.

Figure 14:
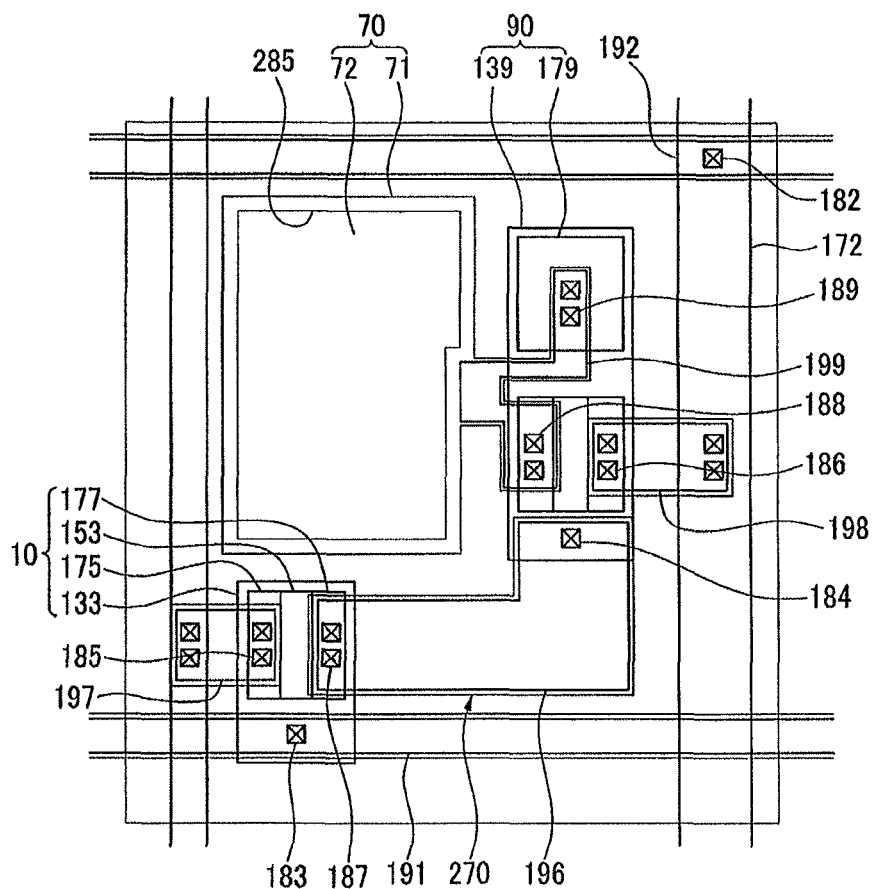
FIG. 14 illustrates a pixel layout view of an OLED display according to an exemplary embodiment.

Referring to FIG. 14, an OLED display 101 and a manufacturing method thereof according to an exemplary embodiment will now be described. The method for manufacturing the OLED display 101 according to an exemplary embodiment will now be described with respect to a first thin film transistor 10, a second thin film transistor 20, and a capacitor 90 according to the stacked order.

Figure 2:
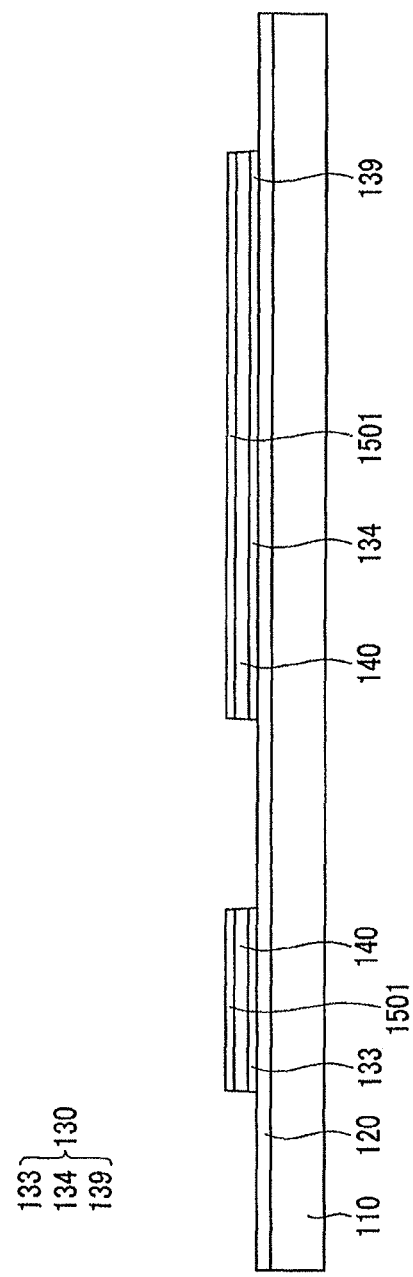

As shown in FIG. 1 and FIG. 2, a buffer layer 120 is formed on a substrate 110. The substrate 110 is formed as a transparent insulating substrate, e.g., a substrate made of glass, quartz, ceramic, or plastic. However, the exemplary embodiment is not restricted thereto. Further, when the substrate 110 is made of plastic, it may be formed to be a flexible substrate.

The buffer layer 120 is formed to be a single layer or multiple layers including at least one of a silicon oxide layer and a silicon nitride layer by using chemical vapor deposition or physical vapor deposition, which are known to a person skilled in the art. The buffer layer 120 prevents diffusion or penetration of moisture or impurities generated from the substrate 110, smoothes the surface of the substrate 110, and controls transmission speed of heat during a crystallization process for forming a semiconductor layer. The buffer layer 120 may be omitted depending on types of the substrate 110 and process conditions.

A first amorphous silicon layer, i.e., an impurity-doped first amorphous silicon layer, a gate insulating layer, and a second amorphous silicon layer, i.e., an impurity-non-doped second amorphous silicon layer, are sequentially stacked on the buffer layer 120. The first amorphous silicon layer and the second amorphous silicon layer are crystallized to form respective first polysilicon layer, i.e., an impurity-doped first polysilicon layer, and a second polysilicon layer, i.e., an impurity-non-doped second polysilicon layer. In this instance, a rapid thermal annealing (RTA) process is used for the crystallization method. However, the exemplary embodiment is not restricted thereto, and various crystallization methods known to a skilled person in the art are usable. For example, the impurity doped into the first amorphous silicon layer is an N-type impurity. Various kinds of impurities known to a person skilled in the art can be used for the N-type impurity.

The stacked first polysilicon layer, gate insulating layer, and second polysilicon layer are patterned through a first photolithography process to form a first polysilicon layer pattern 130, a gate insulating layer pattern 140, and a second polysilicon layer pattern intermediate 1501, respectively. As illustrated in FIG. 1, the first polysilicon layer pattern 130, the gate insulating layer pattern 140, and the second polysilicon layer pattern intermediate 1501 are formed with the same pattern, e.g., have a substantially same shape and completely overlap each other.

As indicated in FIG. 2, the first polysilicon layer pattern 130 includes a first gate electrode 133, a second gate electrode 134, and a first capacitor electrode 139. Also, the gate insulating layer pattern 140 is formed inclusive of various insulating materials known to a person skilled in the art, e.g., tetraethyl orthosilicate (TEOS), silicon nitride (SiN$_x$), and silicon oxide (SiO$_2$).

Figure 3:
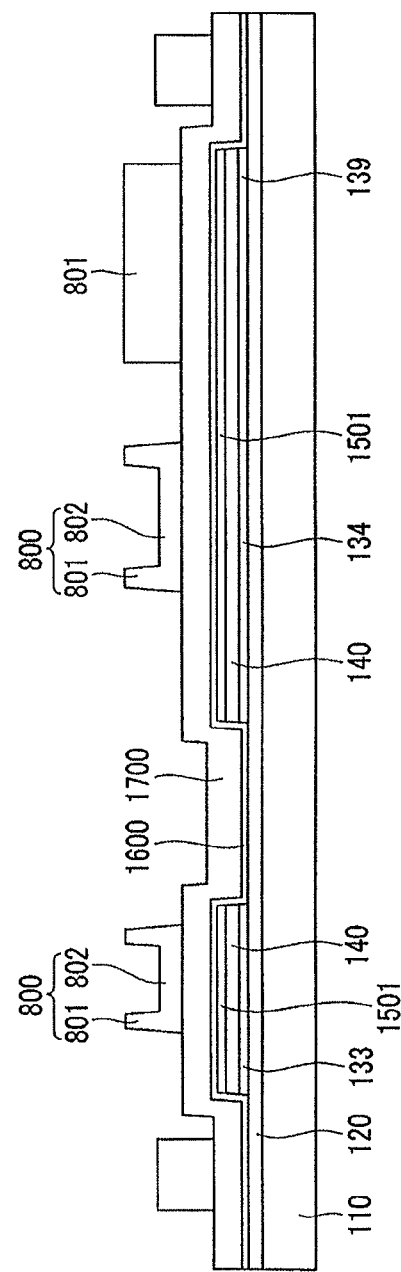

As shown in FIG. 3, a third amorphous silicon layer 1600, i.e., an impurity-doped amorphous silicon layer, and a data metal layer 1700 are sequentially stacked on the second polysilicon layer pattern intermediate 1501. Here, the impurity doped into the third amorphous silicon layer 1600 is an N-type impurity. Also, the data metal layer 1700 includes at least one of, e.g., aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

A photosensitive film pattern 800 is formed on the data metal layer 1700 through an exposing and developing process. For example, the exposure process may include a halftone exposure process or a double exposure process. The photosensitive film pattern 800 has a plurality of thicknesses. For example, the photosensitive film pattern 800 includes a first thickness unit 801, a second thickness unit 802 thinner than the first thickness unit 801, and an opening having substantially no thickness. Here, having "substantially no thickness" signifies that a very thin film that does not influence the process may remain.

Figure 4:
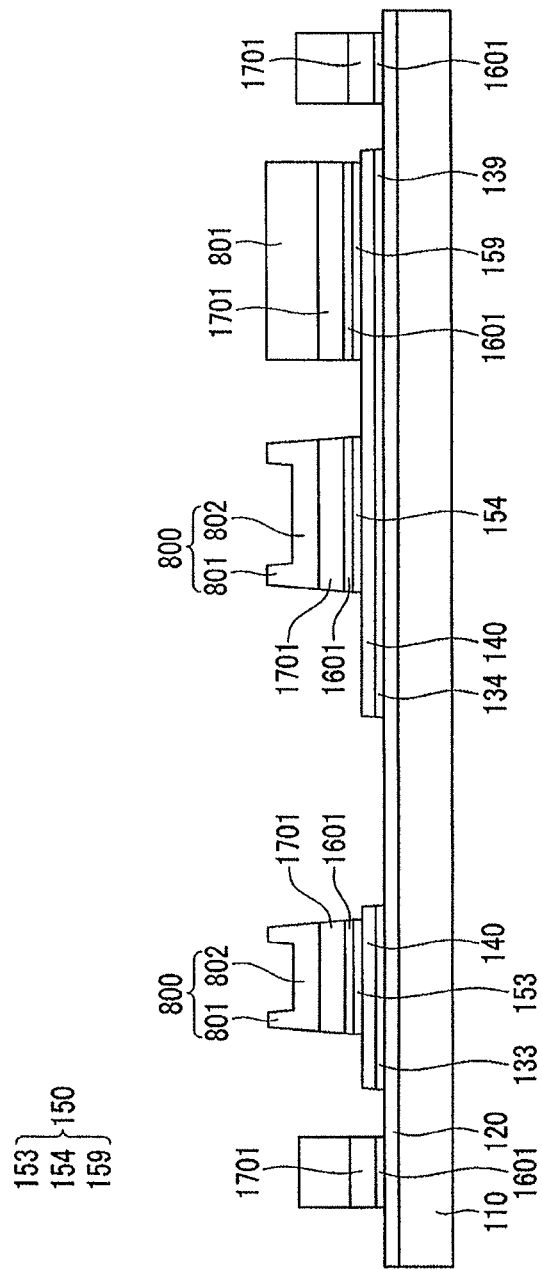

As shown in FIG. 4, a second polysilicon layer pattern 150, a third amorphous silicon layer pattern intermediate 1601, and a data metal layer pattern intermediate 1701 are formed by patterning the second polysilicon layer pattern intermediate 1501, the third amorphous silicon layer 1600, and the data metal layer 1700 through a first etching process using the photosensitive film pattern 800 including the first thickness unit 801 and the second thickness unit 802.

The second polysilicon layer pattern 150 includes a first active layer 153, a second active layer 154, and a capacitor polycrystalline dummy layer 159. The first active layer 153 is formed on the first gate electrode 133, and the second active layer 154 is formed on the second gate electrode 134. The capacitor polycrystalline dummy layer 159 is formed on the first capacitor electrode 139.

Figure 5:
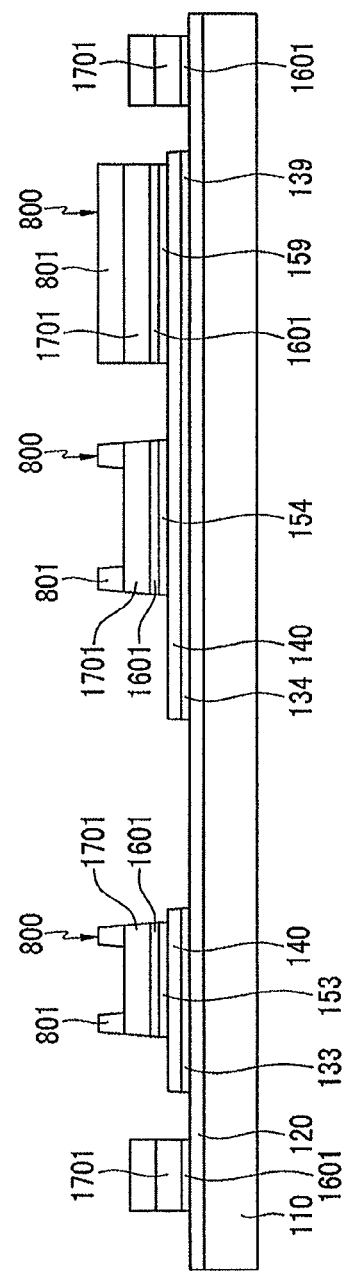

As shown in FIG. 5, the second thickness unit 802 of the photosensitive film pattern 800 is removed through an ashing process. In this instance, the thickness of the first thickness unit 801 of the photosensitive film pattern 800 is reduced by a predetermined degree.

Figure 6:
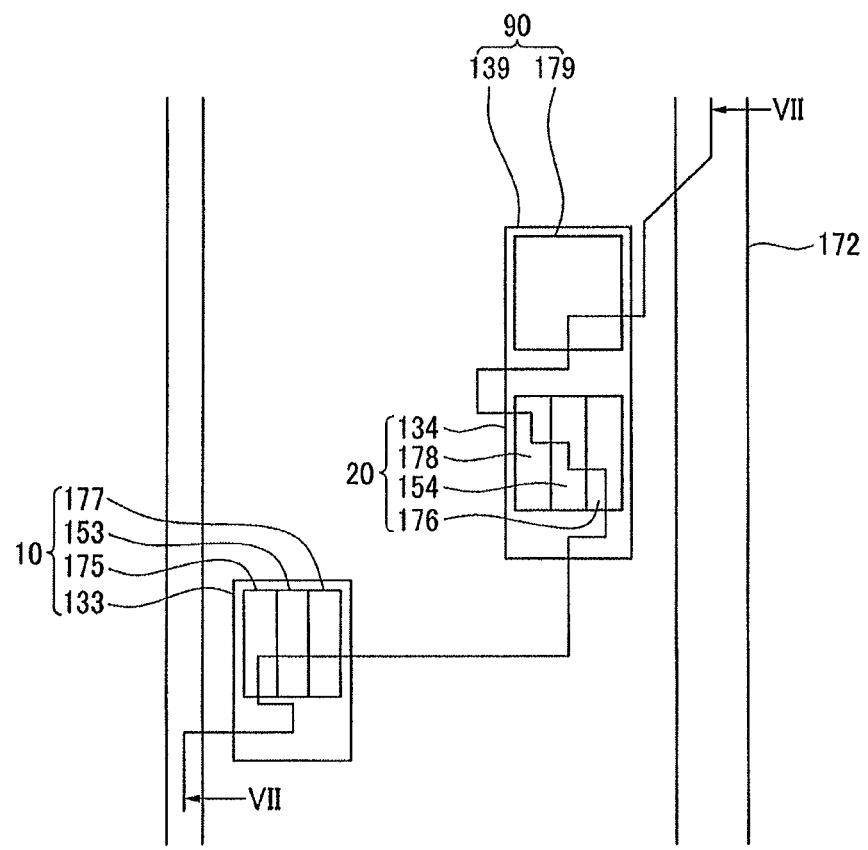
Figure 7:
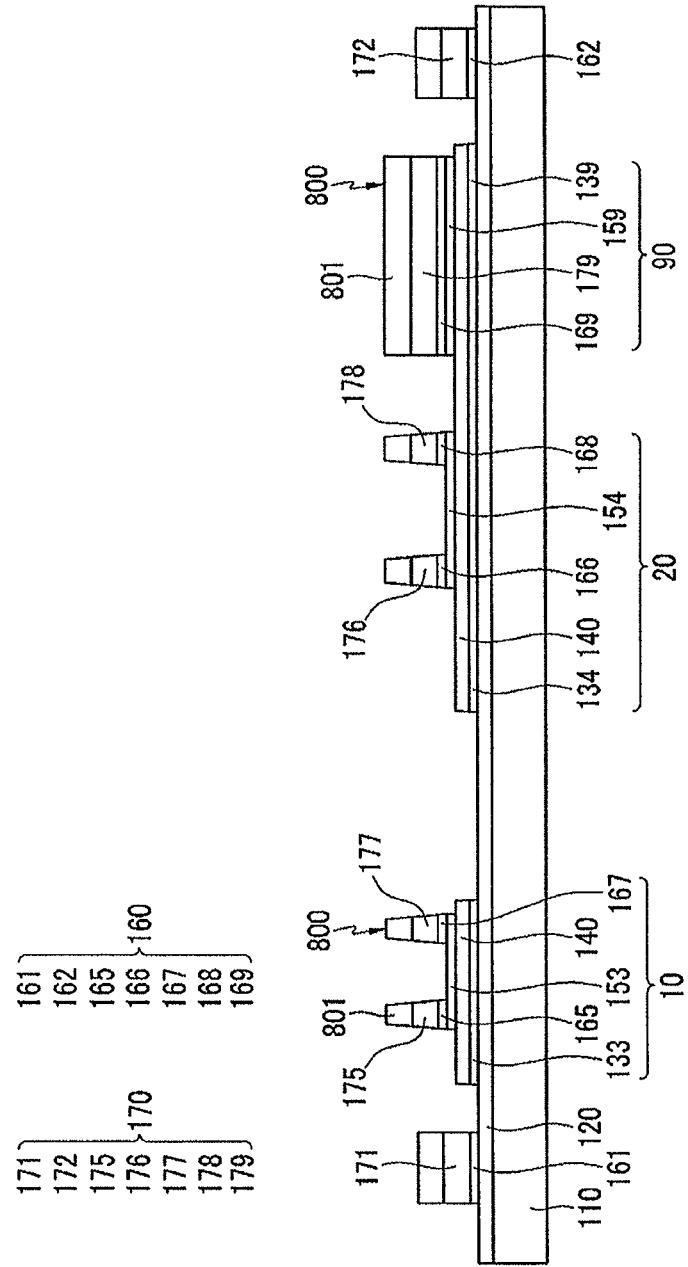

As shown in FIG. 6 and FIG. 7, a third amorphous silicon layer pattern 160 and a data metal layer pattern 170 are formed by patterning the third amorphous silicon layer pattern intermediate 1601 and the data metal layer pattern intermediate 1701 through a second etching process using the photosensitive film pattern 800 including the first thickness unit 801.

The third amorphous silicon layer pattern 160 includes a first source resistant contact layer 165, a first drain resistant contact layer 167, a second source resistant contact layer 166, a second drain resistant contact layer 168, and a capacitor amorphous dummy layer 169.

The first source resistant contact layer 165 and the first drain resistant contact layer 167 are respectively formed in a predetermined region of the first active layer 153. The first source resistant contact layer 165 and the first drain resistant contact layer 167 are separated from each other. The second source resistant contact layer 166 and the second drain resistant contact layer 168 are formed in a predetermined region of the second active layer 154. The second source resistant contact layer 166 and the second drain resistant contact layer 168 are separated from each other. The capacitor amorphous dummy layer 169 is formed on the capacitor polycrystalline dummy layer 159.

The data metal layer pattern 170 includes a first source electrode 175, a first drain electrode 177, a second source electrode 176, a second drain electrode 178, and a second capacitor electrode 179.

The first source electrode 175 is formed on the first source resistant contact layer 165. The first drain electrode 177 is formed on the first drain resistant contact layer 167. The second source electrode 176 is formed on the second source resistant contact layer 166. The second drain electrode 178 is formed on the second drain resistant contact layer 168. The second capacitor electrode 179 is formed on the capacitor amorphous dummy layer 169. The first capacitor electrode 139 and the second capacitor electrode 179 are both electrodes of the capacitor 90.

The data metal layer pattern 170 further includes a data line 171 and a common power line 172. The amorphous silicon layer pattern 160 further includes a dummy data line 161 and a dummy common power line 162 respectively formed below the data line 171 and the common power line 172 in the same pattern as the data line 171 and the common power line 172.

The remaining photosensitive film pattern 800 is removed.

The exposure process, the development process, the first etching process, the ashing process, and the second etching process described with reference to FIG. 3 to FIG. 7 are included in the second photolithography process. In detail, the first thickness unit 801 of the photosensitive film pattern 800 corresponds to positions at which a first source electrode 175, a first drain electrode 177, a second source electrode 176, a second drain electrode 178, and a second capacitor electrode 179 will be formed. The second thickness unit 802 of the photosensitive film pattern 800 corresponds to channel regions of the first active layer 153 and the second active layer 154 that are not overlapped on the first source electrode 175, the first drain electrode 177, the second source electrode 176, and the second drain electrode 178.

Figure 8:
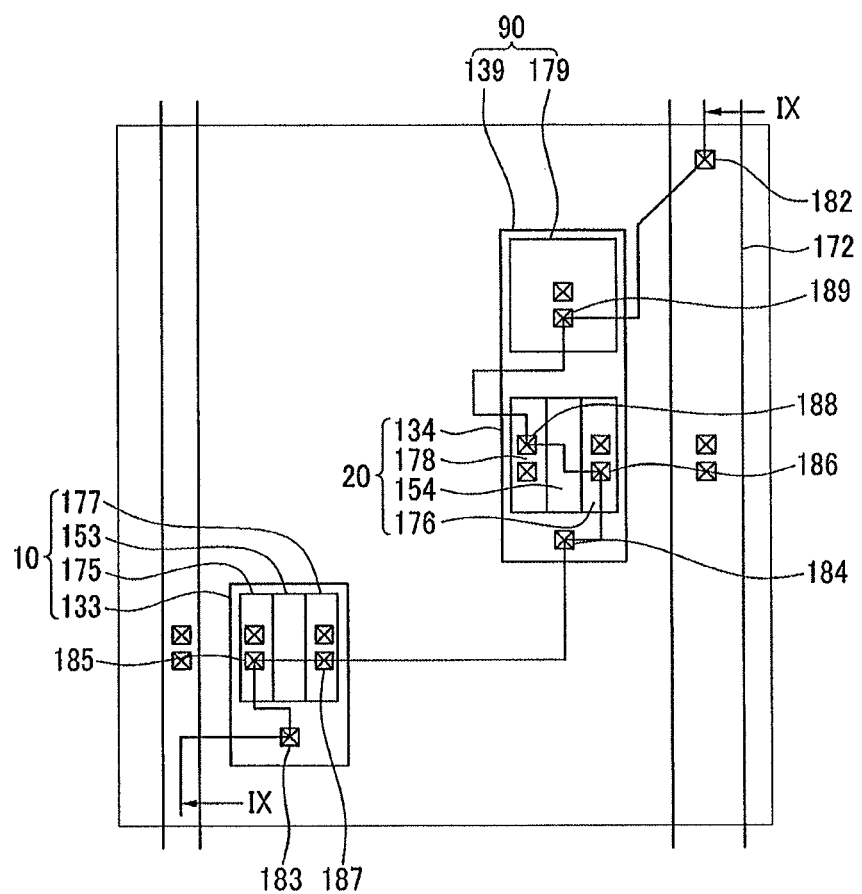
Figure 9:
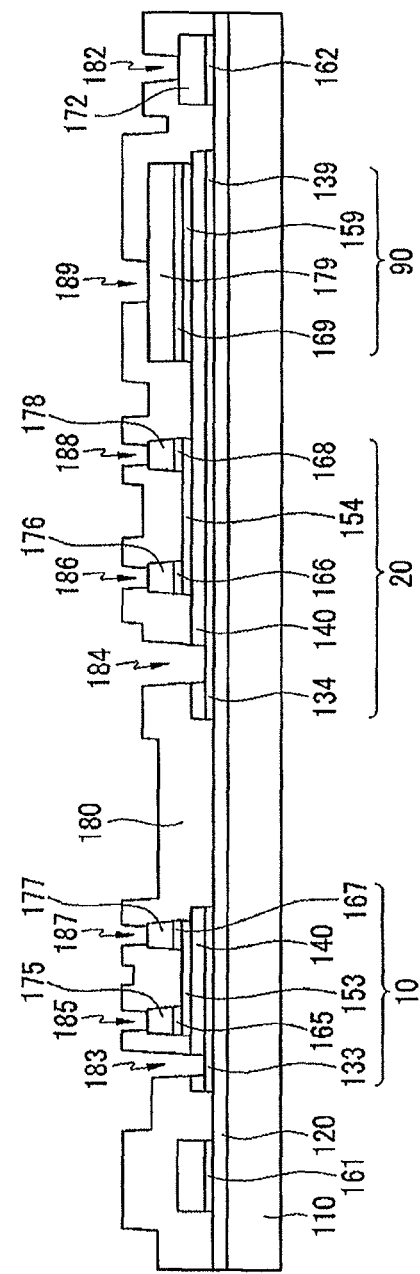

An interlayer insulating layer 180 is formed on the data metal layer pattern 170 as shown in FIG. 8 and FIG. 9. A plurality of contact holes 182, 183, 184, 185, 186, 187, 188, and 189 penetrating the interlayer insulating layer 180 or penetrating the interlayer insulating layer 180 and the gate insulating layer pattern 140 are formed through a third photolithography process.

The contact holes 182, 183, 184, 185, 186, 187, 188, and 189 partially reveal the first gate electrode 133, the second gate electrode 134, the first source electrode 175, the second source electrode 176, the first drain electrode 177, the second drain electrode 178, the second capacitor electrode 179, and the common power line 172.

Figure 10:
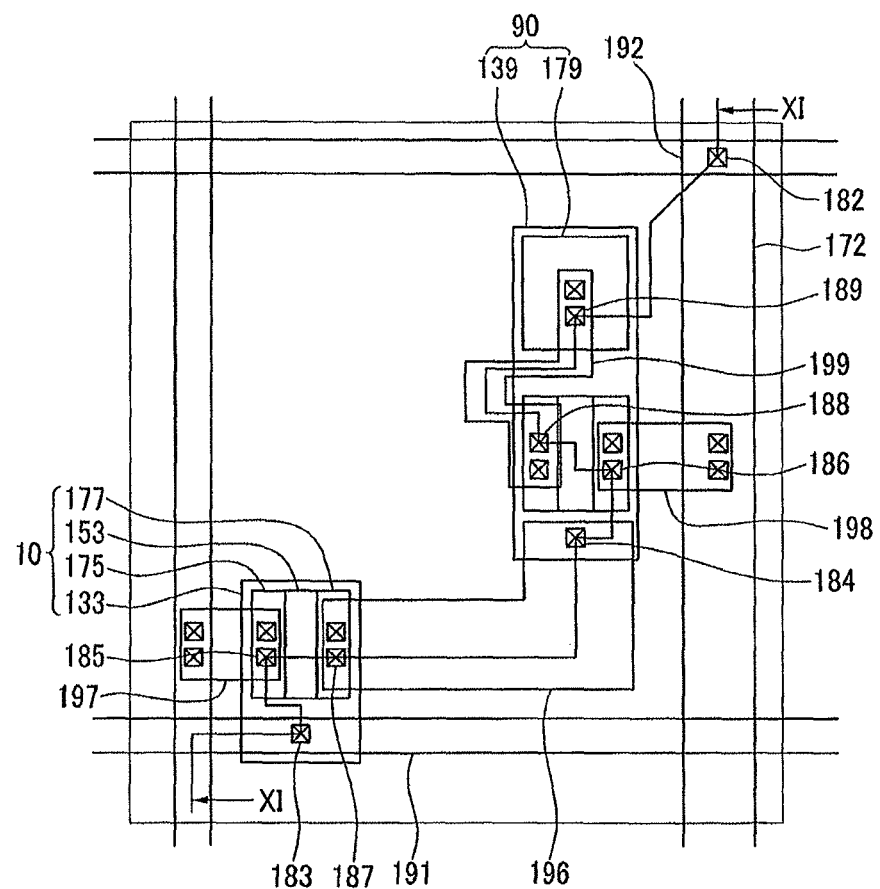
Figure 11:
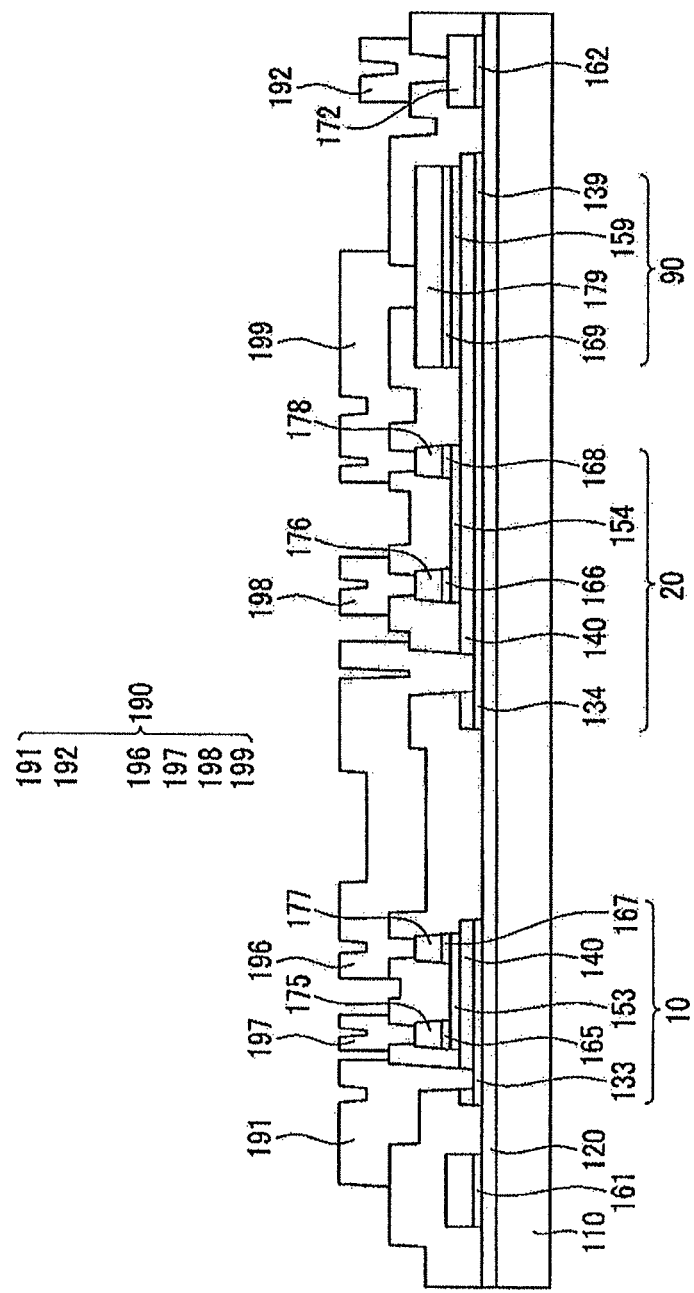

A connecting metal layer pattern 190 is formed on the interlayer insulating layer 180 as shown in FIG. 10 and FIG. 11. The connecting metal layer pattern 190 includes a gate line 191, a first connector 196, a second connector 197, a third connector 198, and a fourth connector 199.

The gate line 191 is connected to the first gate electrode 133 through the contact hole 183. The first connector 196 connects the second gate electrode 134 and the first drain electrode 177 through the contact holes 184 and 187. The second connector 197 connects the first source electrode 175 and the data line 171 through the contact hole 185. The third connector 198 connects the second source electrode 176 and the common power line 172 through the contact hole 186. The fourth connector 199 connects the second drain electrode 178 and the second capacitor electrode 179 through the contact holes 188 and 189.

Also, the connecting metal layer pattern 190 may further include a line connector 192 connected to the common power line 172. The connecting metal layer pattern 190 is formed through a fourth photolithography process.

Figure 12:
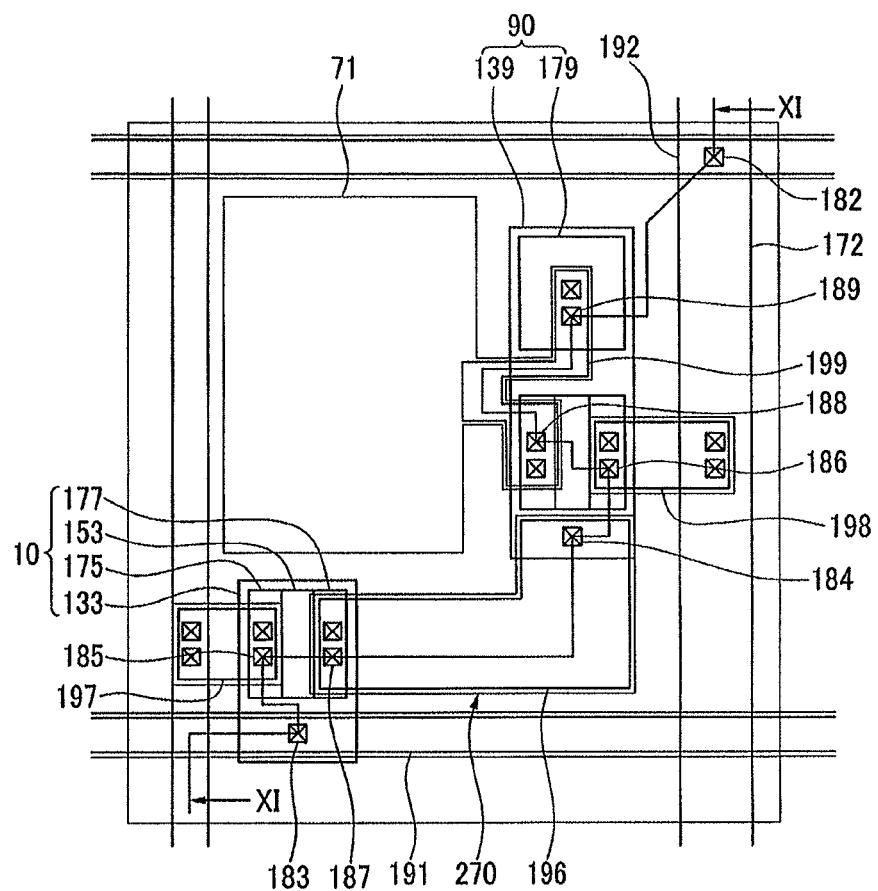
Figure 13:
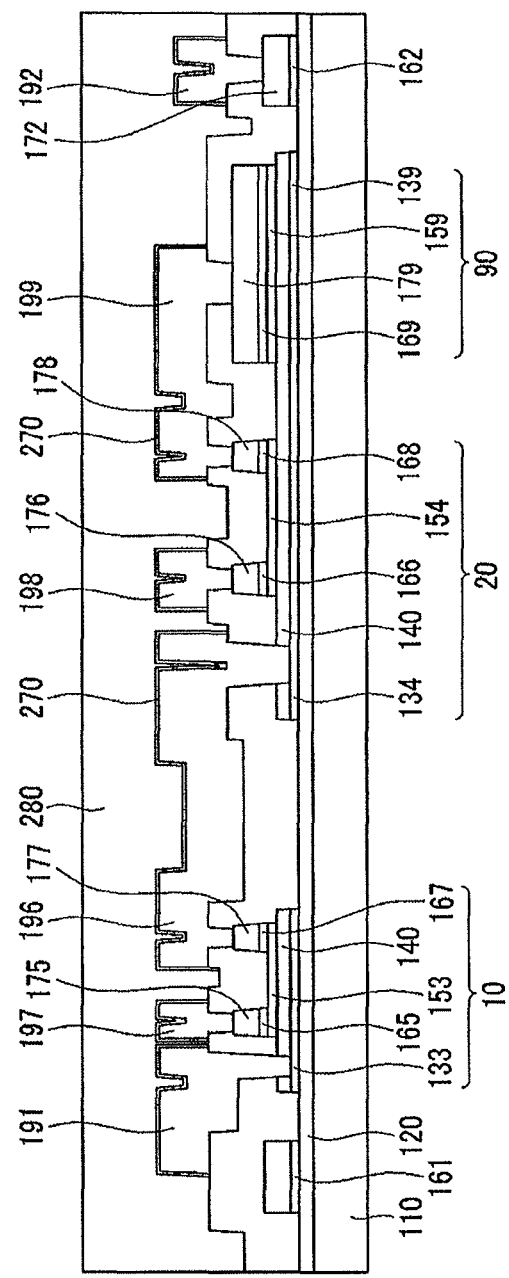

A transparent conductive layer pattern 270 is formed on a predetermined region of the interlayer insulating layer 180 and the whole region of the connecting metal layer pattern 190, as shown in FIG. 12 and FIG. 13. The transparent conductive layer pattern 270 is formed through a fifth photolithography process.

The transparent conductive layer pattern 270 may include at least one of, e.g., indium tin oxide (ITO), indium zinc oxide (IZO), zinc oxide (ZnO), indium oxide ($In_2O_3$), indium gallium oxide (IGO), and aluminum zinc oxide (AZO). The transparent conductive layer pattern 270 is formed just on the interlayer insulating layer 180 to further include a pixel electrode 71 connected to the fourth connector 199.

As shown in FIG. 13, a pixel defining layer 280 is formed on the transparent conductive layer pattern 270. The pixel defining layer 280 includes a pixel opening 285, as illustrated in FIG. 14, for partially revealing the pixel electrode 71. The pixel defining layer 280 is formed through a sixth photolithography process.

As further illustrated in FIG. 14, an organic emission layer 72 is formed on the pixel electrode 71 in the pixel opening 285. A low molecular weight organic material or a high molecular weight organic material may be used for the organic emission layer 72.

The organic emission layer 72 includes a hole transport layer (HTL) and a hole injection layer (HIL) in a direction of the pixel electrode 71 with respect to the emission layer, and also includes an electron transport layer (ETL) and an electron injection layer (EIL) in a direction of the common electrode (not shown). In addition, various layers can be stacked if needed.

A common electrode (not shown) is formed on the organic emission layer 72. The OLED display 101 uses the pixel electrode 71 as an anode and the common electrode as a cathode. However, the exemplary embodiment is not restricted thereto, and the polarities of the pixel electrode 71 and the common electrode may be reversed.

Also, the common electrode is made of a material including a reflecting material. That is, OLED display 101 has a rear light emission structure. In detail, the common electrode may be made of, e.g., Al, Ag, Mg, Li, Ca, LiF/Ca, and/or LiF/Al.

Hence, the organic light emitting element 70 including the pixel electrode 71, the organic emission layer 72, and the common electrode is completed. Although not shown, the OLED display 101 may further include a sealing member for preventing permeation of moisture or oxygen in the organic emission layer 72 of the organic light emitting element 70.

As described above, the OLED display 101 according to exemplary embodiments may be manufactured with a bottom gate structure, i.e., with the gate electrodes 133 and 134 below the respective active layers 153 and 154, via a simplified manufacturing method.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method for manufacturing an organic light emitting diode (OLED) display, the method comprising:
sequentially stacking an impurity-doped first amorphous silicon layer, a gate insulating layer, and an impurity-non-doped second amorphous silicon layer on a substrate;
forming a first polysilicon layer and a second polysilicon layer by crystallizing the first and the second amorphous silicon layers, respectively;
forming a first polysilicon layer pattern, a gate insulating layer pattern, and a second polysilicon layer pattern intermediate in the same pattern by patterning the first polysilicon layer, the gate insulating layer, and the second polysilicon layer;
sequentially stacking an impurity-doped third amorphous silicon layer and a data metal layer on the second polysilicon layer pattern intermediate;
forming a photosensitive film pattern on the data metal layer, the photosensitive film pattern including a plurality of units with different thicknesses; and
forming a second polysilicon layer pattern, a third amorphous silicon layer pattern, and a data metal layer pattern by patterning the second polysilicon layer pattern intermediate, the third amorphous silicon layer, and the data metal layer through the photosensitive film pattern,
wherein forming the second polysilicon layer pattern, third amorphous silicon layer pattern, and data metal layer pattern includes:
forming a second polysilicon layer pattern, a third amorphous silicon layer pattern intermediate, and a data metal layer pattern intermediate by patterning the second polysilicon layer pattern intermediate, the third amorphous silicon layer, and the data metal layer through a first etching process using the photosensitive film pattern, and forming a third amorphous silicon layer pattern and a data metal layer pattern by patterning the third amorphous silicon layer pattern intermediate and the data metal layer pattern intermediate through a second etching process using the photosensitive film pattern, and wherein:
the first polysilicon layer pattern includes a first gate electrode, a second gate electrode, and a first capacitor electrode,
the second polysilicon layer pattern includes a first active layer and a second active layer formed on the first gate electrode and the second gate electrode, respectively, and a capacitor polycrystalline dummy layer formed on the first capacitor electrode,
the third amorphous silicon layer pattern includes a first source resistant contact layer and a first drain resistant contact layer respectively formed on a region of the first active layer, a second source resistant contact layer and a second drain resistant contact layer formed on a region of the second active layer, a capacitor amorphous dummy layer formed on the capacitor polycrystalline dummy layer, a dummy data line, and a dummy common power line, and
the data metal layer pattern includes a first source electrode, a first drain electrode, a second source electrode, and a second drain electrode respectively formed on the first source resistant contact layer, the first drain resistant contact layer, the second source resistant contact layer, and the second drain resistant contact layer, a second capacitor electrode formed on the capacitor amorphous dummy layer, a data line formed on the dummy data line, and a common power line formed on the dummy common power, and
wherein the photosensitive film pattern includes a first thickness unit, a second thickness unit thinner than the second thickness unit, and an opening having no thickness.

2. A method for manufacturing an organic light emitting diode (OLED) display, the method comprising:
sequentially stacking an impurity-doped first amorphous silicon layer, a gate insulating layer, and an impurity-non-doped second amorphous silicon layer on a substrate;
forming a first polysilicon layer and a second polysilicon layer by crystallizing the first and the second amorphous silicon layers, respectively;
forming a first polysilicon layer pattern, a gate insulating layer pattern, and a second polysilicon layer pattern intermediate in the same pattern by patterning the first polysilicon layer, the gate insulating layer, and the second polysilicon layer;
sequentially stacking an impurity-doped third amorphous silicon layer and a data metal layer on the second polysilicon layer pattern intermediate;
forming a photosensitive film pattern on the data metal layer, wherein the photosensitive film pattern includes a first thickness unit, a second thickness unit thinner than the second thickness unit, and an opening having no thickness; and
forming a second polysilicon layer pattern, a third amorphous silicon layer pattern, and a data metal layer pattern by patterning the second polysilicon layer pattern intermediate, the third amorphous silicon layer, and the data metal layer through the photosensitive film pattern.

3. The method of claim 2, wherein:
the first thickness unit of the photosensitive film pattern corresponds to positions on the data metal line at which a first source electrode, a first drain electrode, a second source electrode, a second drain electrode, and a second capacitor electrode will be formed, and
the second thickness unit of the photosensitive film pattern corresponds to positions on the second polysilicon layer pattern at which channel regions of a first active layer and a second active layer that are not overlapped on the first source electrode, the first drain electrode, the second source electrode, and the second drain electrode will be formed.

4. The method of claim 3, wherein:
a first etching process is performed through the first thickness unit and the second thickness unit of the photosensitive film pattern, and
a second etching process is performed through the first thickness unit when the second thickness unit of the photosensitive film pattern is removed.

5. The method of claim 1, wherein the data metal layer is formed of at least one of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

6. A method for manufacturing an organic light emitting diode (OLED) display, the method comprising:
sequentially stacking an impurity-doped first amorphous silicon layer, a gate insulating layer, and an impurity-non-doped second amorphous silicon layer on a substrate;
forming a first polysilicon layer and a second polysilicon layer by crystallizing the first and the second amorphous silicon layers, respectively;
forming a first polysilicon layer pattern, a gate insulating layer pattern, and a second polysilicon layer pattern intermediate in the same pattern by patterning the first polysilicon layer, the gate insulating layer, and the second polysilicon layer, the first polysilicon layer pattern including a first gate electrode, a second gate electrode, and a first capacitor electrode;
sequentially stacking an impurity-doped third amorphous silicon layer and a data metal layer on the second polysilicon layer pattern intermediate;
forming a photosensitive film pattern on the data metal layer, the photosensitive film pattern including a plurality of units with different thicknesses;
forming a second polysilicon layer pattern, a third amorphous silicon layer pattern, and a data metal layer pattern by patterning the second polysilicon layer pattern intermediate, the third amorphous silicon layer, and the data metal layer through the photosensitive film pattern, the data metal layer pattern including a first source electrode, a first drain electrode, a second source electrode, and a second drain electrode;
forming an interlayer insulating layer on the data metal layer pattern;
forming a plurality of contact holes for partially revealing the first gate electrode, the second gate electrode, the first source electrode, the second source electrode, the first drain electrode, the second drain electrode, and the second capacitor electrode by etching at least one of the interlayer insulating layer and the gate insulating layer pattern;

forming a connecting metal layer pattern on the interlayer insulating layer; and forming a transparent conductive layer pattern on the interlayer insulating layer and the connecting metal layer pattern.

7. The method of claim 6, wherein the transparent conductive layer pattern is formed of at least one of indium tin oxide (ITO), indium zinc oxide (IZO), zinc oxide (ZnO), indium oxide ($In_2O_3$), indium gallium oxide (IGO), and aluminum zinc oxide (AZO).

8. The method of claim 6, wherein the connecting metal layer pattern includes a gate line connected to the first gate electrode through the plurality of contact holes, a first connector for connecting the second gate electrode and the first drain electrode, a second connector for connecting the first source electrode and a data line, a third connector for connecting the second source electrode and a common power line, and a fourth connector for connecting the second drain electrode and the second capacitor electrode.

9. The method of claim 6, wherein the transparent conductive layer pattern further comprises a pixel electrode formed on the interlayer insulating layer and connected to the second drain electrode.

10. The method of claim 9, further comprising:

forming an organic emission layer on the pixel electrode; and forming a common electrode on the organic emission layer.

\* \* \* \* \*